US005091689A

United States Patent [19]

Katao

[11] Patent Number: 5,091,689

[45] Date of Patent: Feb. 25, 1992

[54] CONSTANT CURRENT CIRCUIT AND INTEGRATED CIRCUIT HAVING SAID CIRCUIT

[75] Inventor: Shuichi Katao, Atsugi, Japan

[73] Assignee: Canon Kabushiki Kaisha, Tokyo, Japan

[21] Appl. No.: 552,704

[22] Filed: Jul. 16, 1990

[30] Foreign Application Priority Data

Jul. 19, 1989 [JP] Japan ................................ 1-186610

[51] Int. Cl.[5] ................................................ H03K 3/20

[52] U.S. Cl. ................................ 323/312; 307/296.7; 307/296.8; 307/544; 357/43

[58] Field of Search ................ 323/312, 316; 307/495, 307/499, 544, 296.1, 296.6, 296.7, 296.8; 357/43, 22 G

[56] References Cited

U.S. PATENT DOCUMENTS 3,303,413 2/1967 Warner, Jr. et al. .
4,678,936 7/1987 Holloway ...................... 323/312 X
4,891,533 1/1990 Holloway ...................... 323/312 X

*Primary Examiner*—Peter S. Wong
*Assistant Examiner*—Emanuel Todd Voeltz
*Attorney, Agent, or Firm*—Fitzpatrick, Cella, Harper & Scinto

[57] ABSTRACT

A constant current circuit comprises a junction type field effect transistor and a bipolar transistor. The channel forming region of the junction type field effect transistor and the base region of the bipolar transistor are constituted to be common to each other.

9 Claims, 2 Drawing Sheets

CONSTANT CURRENT CIRCUIT AND INTEGRATED CIRCUIT HAVING SAID CIRCUIT

BACKGROUND OF THE INVENTION

Field of the Invention

This invention relates to a constant current circuit and an integrated circuit having said circuit, particularly to a constant current circuit and an integrated circuit having said circuit which can be suitably used in an analog integrated circuit.

Various circuits have been proposed up to date as the constant current circuit to be used in analog integrated circuits.

FIG. 1 shows a circuit showing an example of the constant current circuit of the prior art. In the Figure, $T_a$, $T_b$ and $T_1$-$T_3$ represent transistors, $Z_1$-$Z_3$ loads and $R_a$, $R_b$ and $R_1$-$R_3$ resistors. $I_1$-$I_3$ are constant currents obtained in the circuit shown in FIG. 1. Such constant current circuit makes $I_1$-$I_3$ constant currents respectively by setting $T_1$ and $R_1$, $T_2$ and $R_2$, and $T_3$ and $R_3$ based on the bias potential $V_b$ set by the transistor $T_a$ and $T_b$, and resistors $R_a$ and $R_b$, not depending on fluctuations of $Z_1$-$Z_3$.

Also, FIG. 2 shows another example of the constant current circuit of the prior art. In the Figure, $T_a$, $T_b$, $T_1$ and $T_2$ each represent a transistor, $Z_1$ and $Z_2$ each a load, $I_1$ and $I_2$ each a constant current obtained in the circuit shown in FIG. 2, and $R_a$ and $R_b$ each a resistor. Also in such constant current circuit, constant currents $I_1$ and $I_2$ are obtained on the basis of the bias potential $V_b$ generated by setting of $I_o$ with the band gap output voltages $V_{BG}$ and $R_a$.

However, the constant current circuits of the prior art as mentioned above had the following tasks.

(1) In the constant current circuit shown in FIG. 1, errors of current values occur due to variance in characteristics of the transistors, whereby desired constant currents cannot be sometimes obtained with good precision. Also, for solving this problem, the choice of transistors is required or a more complicated circuit construction is required.

(2) In the constant current circuit shown in FIG. 2, because a band gap circuit and an amplifier circuit are required, the circuit scale is large and complicated.

SUMMARY OF THE INVENTION

The present invention has been accomplished in view of such tasks possessed by the constant current circuits of the prior art, and its object is to provide a constant current circuit, which is simple in circuit constitution, small in the occupied area within the integrated circuit, and low in error of current value.

It is another object of the present invention to provide a constant current circuit with little variance in precision depending on the parts constituting the circuit, and also low in cost.

Still another object of the present invention is to provide a constant current circuit comprising a junction type field effect transistor and a bipolar transistor, the channel forming region of said junction type field effect transistor and the base region of said bipolar transistor being constituted to be common to each other, and an integrated circuit having same circuit.

Still another object of the present invention is to provide a circuit device comprising a bipolar transistor having a collector region of a first conduction type, a base region of a conduction type opposite to the first conduction type and an emitter region of the first conduction type, and a junction type field effect transistor having a gate region of the first conduction type electrically connected to said collector region and a source region and a drain region of the opposite conduction type provided in contact with the base region of said bipolar transistor and with said gate region sandwiched therebetween.

DESCRIPTION OF THE PREFERRED EMBODIMENTS

Figure 1:
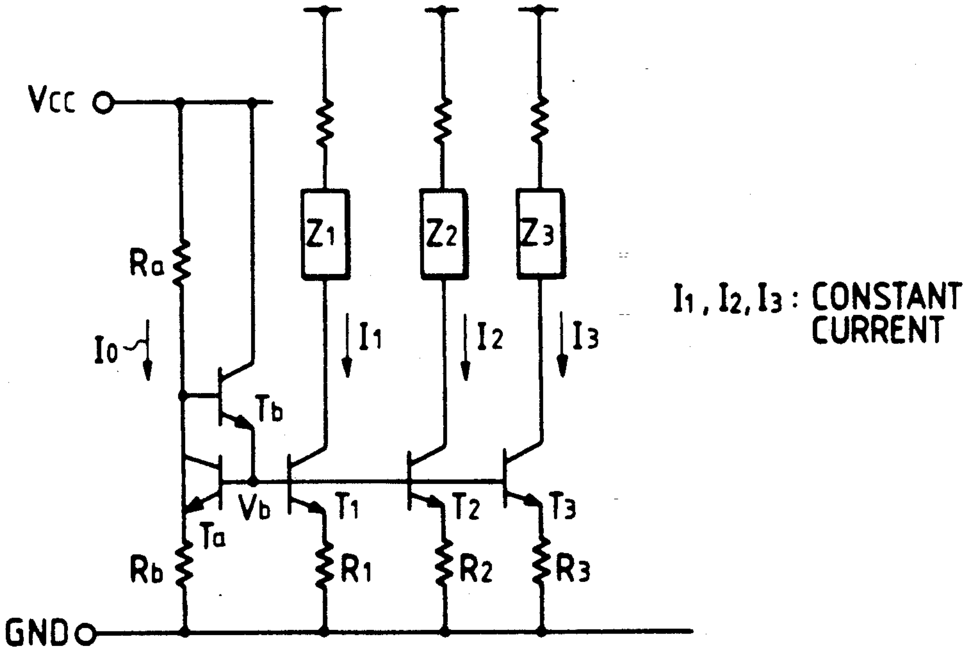
FIG. 1 PRIOR ART
FIG. 1 is a circuit diagram showing an example of the constant current circuit of the prior art.

The tasks as described above can be accomplished by the constitution as described below.

That is, the constant current circuit and the integrated circuit having said circuit has a junction type field effect transistor and a bipolar transistor, and the channel forming region of said junction type field effect transistor and the base region of said bipolar transistor are constituted to be common to each other. In this constitution, it is preferable, also from the point of being effected by other elements or circuits when formed into an integrated circuit, that the above-mentioned junction type field effect transistor and the above-mentioned bipolar transistor be formed in the same isolation region.

Further, in the present invention, it is desirable that the gate region of the junction type field effect transistor and the collector region of the bipolar transistor be also made common to each other.

Also, the circuit device of the present invention has a bipolar transistor having a collector region of a first conductivity type, a base region of the opposite conductivity to the first conductivity type and an emitter region of the first conductivity type, and a junction type field effect transistor. The junction type field effect transistor has a gate region of the first conductivity type electrically connected to said collector region and a source region and a drain region of the opposite conductivity type provided in contact with the base region of said bipolar transistor said gate region is provided sandwiched therebetween.

More specifically, the present invention, by making the channel formation region of a junction type field effect transistor (hereinafter written as JFET) and the base region of a bipolar transistor (hereinafter written as BPT) common to each other, is adapted to compensate the variance of collector current of BPT due to variance of the width of the base of BPT (the width of channel formation region in JFET) with the drain current, thereby maintaining the collector current of BPT constant. Therefore, according to the constant current circuit of the present invention, variance of current value caused by variance of the base width of BPT can be excluded.

Also, the constant current circuit of the present invention, by forming JFET and BPT within the same isolation, region and further making the channel formation region of JFET and the base region of BPT common to each other, can simplify the circuit constitution and reduce the occupied area by the circuit within the integrated circuit. Further, by making the gate region of JFET and the collector region of BPT common to each other, or alternatively by forming continuously the gate region and the collector region as the same conduction type region, further simplification and area reduction are rendered possible.

EXAMPLE

Referring now to the drawings, a preferable example of the constant current circuit of the present invention is described.

Figure 2:
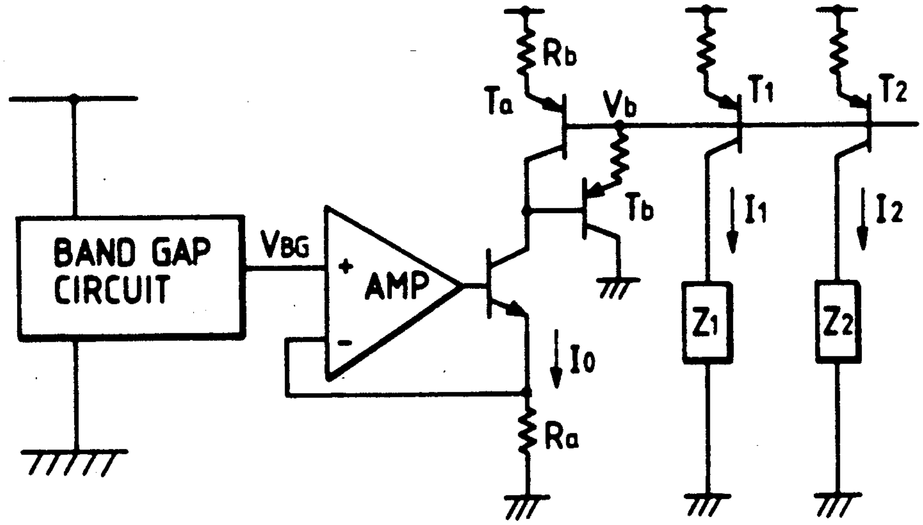
FIG. 2 PRIOR ART
FIG. 2 is a circuit diagram showing another example of the constant current circuit of the prior art.
Figure 3A:
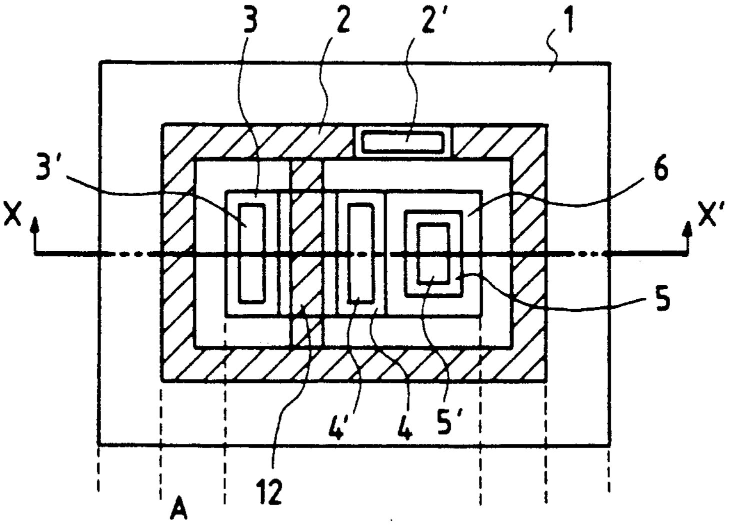
FIG. 3A is a schematic top view showing the pertinent portion of the constant current circuit according to the present invention.
Figure 3B:
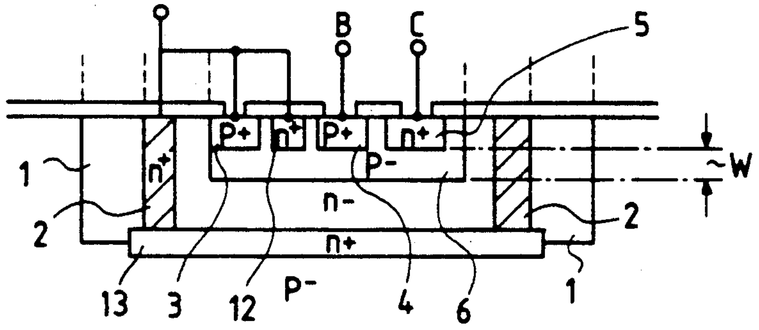
FIG. 3B is a schematic sectional view taken along X—X' of the circuit shown in FIG. 3A.

FIG. 3A is a schematic top view showing the pertinent portion of the constant current circuit according to this example, and has a NPN type BPT (hereinafter written merely as BPT) and a P channel JFET (hereinafter written merely as JFET) formed therein. BPT and JFET correspond to the transistors $T_a$ and $T_b$ in FIG. 1 or FIG. 2, respectively. FIG. 3B is a schematic sectional view taken along X—X' in the circuit shown in FIG. 3A. In FIGS. 3A and 3B, 1 is an isolation region for separating other elements from the present circuit, 2 is a collector region of a first conduction type BPT, 12 is a gate region of JFET of the same conductivity type electrically connected to the above-mentioned collector region 2, is 2' a contact portion of the gate 12 functioning as both the collector of BPT and the gate of JFET, 3 is a source (or drain) region of JFET of the conduction type opposite to the first conductivity type, 4 functions as both a base contact region of BPT and a drain (or source) region of JFET, 4' is a contact portion functioning as both a base region 6 of BPT and the drain 4 of JFET, 5 is an emitter region of BPT, 5' a contact portion of the emitter 5 is of BPT, and 6 functions as both a base region of BPT and a channel formation region of JFET. 13 is an embedded region of the first conduction type. The amounts of the impurities doped to the respective conductivity types may be determined as desired.

Figure 4:
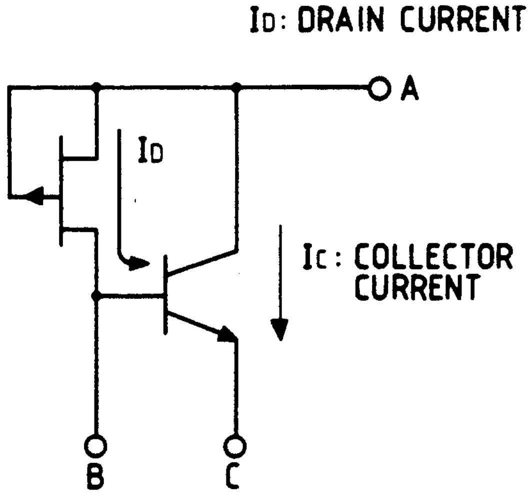
FIG. 4 is a circuit diagram showing the equivalent circuit of the circuit shown in FIG. 3A and FIG. 3B.

FIG. 4 is a circuit diagram showing the equivalent circuit of the circuit shown in FIGS. 3A and 3B. In the Figure, terminals A, B, C correspond to the terminals A, B, C shown in FIG. 3B, respectively.

By constructing a constant current circuit as shown in FIG. 2 by using such a circuit, a constant current circuit with little error of current value can be obtained.

In the following, the reason why variance of the collector current of BPT can be suppressed as small with the constitution shown in FIG. 3A and FIG. 3B is described by referring to FIG. 3B.

In FIG. 3B, W is the width of the base of BPT, and also the width of the channel formation region of JFET.

Hence, when W has becomes larger because of variance during preparation, the amplification ratio $\beta$ of the BPT becomes smaller due to enlargement of the base width of BPT. However, because the width of the channel formation region of JFET is also enlarged at the same time, the drain current of said JFET, namely the base current of BPT becomes greater to compensate the reduction in the amplification ratio $\beta$, whereby the collector current of BPT becomes constant.

On the contrary, when W has become smaller because of variance during preparation, the amplification ratio $\beta$ becomes larger, but the drain current of JFET becomes smaller, whereby the collector current can be made constant.

As described above, the constitution shown in FIGS. 3A and 3B, and the circuit shown in FIG. 4 can make the collector current value of BPT constant, thereby removing substantially variance occurring during preparation, because the collector current value will not be changed depending on variance of W during preparation.

Also, in this example, since the channel formation region of JFET and the base of BPT as well as the gate of JFET and the collector of BPT were made common to each other, respectively, the constitution of the constant current circuit could be simplified, and also the occupied area of the circuit could be made smaller.

EFFECT

As described above in detail, according to the present invention, a constant current circuit with small occupied area within the integrated circuit as well as good precision can be provided.

Therefore, according to the present invention, an analog integrated circuit with small chip size and high reliability can be provided.

I claim:

1. A constant current circuit comprising:

- a junction type field effect transistor comprising a channel forming region; and
- a bipolar transistor comprising a base region, said channel forming region and said base region being common to each other.

2. A constant current circuit according to claim 1, wherein said junction type field effect transistor and said bipolar transistor are formed in a common region surrounded by an isolation region.

3. A constant current circuit according to claim 1, wherein said junction type field effect transistor further comprises a gate region, wherein said bipolar transistor further comprises a collector region, and wherein said gate region and said collector region are common to each other.

4. A circuit device comprising:

- a bipolar transistor comprising,
  - a collector region of a first conductivity type,
  - a base region of a second conductivity type opposite to the first conductivity type, and
  - an emitter region of the first conductivity type; and
- a junction type field effect transistor comprising,
  - a gate region of the first conductivity type electrically connected to said collector region,
  - a source region, and
  - a drain region of the second conductivity type, wherein said source region and said drain region are provided in contact with said base region of said bipolar transistor, and wherein said gate region is disposed between said drain region and said source region.

5. A circuit device according to claim 4, wherein said bipolar transistor comprises a high resistance region of the first conductivity type disposed between said base region and said collector region.

6. A circuit device according to claim 4, wherein said collector region of said bipolar transistor and said gate region of said junction type field effect transistor are disposed in continuous regions of a same conductivity type.

7. A circuit device according to claim 4, wherein said first conductivity type is n type.

8. A circuit device according to claim 4, wherein said first conductivity type is p type.

9. A circuit device according to claim 4, wherein at least one of said source region and said drain region is a contact region for said base region of said bipolar transistor.

* * * * *

UNITED STATES PATENT AND TRADEMARK OFFICE
CERTIFICATE OF CORRECTION

PATENT NO. : 5,091,689

DATED : February 25, 1992

INVENTOR(S) : SHUICHI KATAO

It is certified that error appears in the above-identified patent and that said Letters Patent is hereby corrected as shown below:

COLUMN 1

Line 35, "tasks." should read --problems.--.
Line 49, "tasks" should read --problems--.

COLUMN 3

Line 31, "is 2′" should read --2′ is--.
Line 38, "5′ a" should read --5′ is a--.
Line 39, "is" should be deleted.
Line 58, "has" should be deleted.

COLUMN 4

Line 44, "comprising," should read --comprising:--.
Line 50, "comprising," should read --comprising:--.

Signed and Sealed this

Tenth Day of August, 1993

Attest:

Michael K. Kirk

MICHAEL K. KIRK

*Attesting Officer*

*Acting Commissioner of Patents and Trademarks*